United States Patent
Pocius et al.

(10) Patent No.: US 6,803,092 B2
(45) Date of Patent: Oct. 12, 2004

(54) SELECTIVE DEPOSITION OF CIRCUIT-PROTECTIVE POLYMERS

(75) Inventors: Alphonsus V. Pocius, Maplewood, MN (US); Rita A. Latourelle, Round Rock, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 399 days.

(21) Appl. No.: 09/891,559

(22) Filed: Jun. 26, 2001

(65) Prior Publication Data

US 2003/0008156 A1 Jan. 9, 2003

(51) Int. Cl.⁷ ............................. H05K 1/00; B32B 3/00
(52) U.S. Cl. ...................... 428/209; 428/901; 174/251; 174/254; 174/258
(58) Field of Search ................. 428/209; 174/251, 174/254, 258

(56) References Cited

U.S. PATENT DOCUMENTS

| | | | |
|---|---|---|---|
| 3,892,646 A | 7/1975 | Lazzarini et al. ........... 204/181 |
| 4,592,816 A | 6/1986 | Emmons et al. ........... 204/180 |
| 4,629,685 A | 12/1986 | Pfeifer ...................... 430/583 |
| 4,656,116 A | 4/1987 | Rohde et al. ............... 430/197 |
| 4,676,854 A | 6/1987 | Suzuki et al. ............... 156/151 |
| 4,832,808 A | 5/1989 | Buchwalter .............. 204/181.7 |
| 4,844,784 A | 7/1989 | Suzuki et al. ........... 204/180.9 |
| 4,845,012 A | 7/1989 | Seko et al. ................. 430/287 |
| 4,877,818 A | 10/1989 | Emmons et al. .............. 522/26 |
| 4,904,360 A | 2/1990 | Wilson, Jr. et al. |
| 4,914,182 A | 4/1990 | Pfeifer et al. ............... 528/353 |
| 4,925,912 A | 5/1990 | Rohde et al. ............... 528/226 |
| 4,956,096 A | 9/1990 | Arlt et al. |
| 5,055,164 A | 10/1991 | Hawkins et al. .............. 204/15 |
| 5,181,984 A | 1/1993 | Matsumura et al. ......... 156/630 |
| 5,384,229 A | 1/1995 | Pai et al. ..................... 430/270 |
| 5,439,774 A | 8/1995 | Iwasawa et al. ............ 430/190 |
| 5,501,941 A | 3/1996 | Ngo ........................... 430/270 |
| 5,504,830 A | 4/1996 | Ngo et al. ................... 385/123 |
| 5,532,110 A | 7/1996 | Ngo ........................... 430/275 |
| 5,599,655 A | 2/1997 | Ngo ........................... 430/325 |
| 5,607,818 A | 3/1997 | Akram et al. ............... 430/311 |
| 6,042,682 A * | 3/2000 | Funaya et al. ........... 156/273.3 |
| 6,046,886 A | 4/2000 | Himes et al. ............... 360/104 |
| 2003/0007292 A1 | 1/2003 | Himes et al. |

FOREIGN PATENT DOCUMENTS

| | | | |
|---|---|---|---|
| EP | 0 456 463 A2 | 11/1994 | .......... G03F/7/038 |
| JP | P2000-4072 A | 1/2000 | ............ H05K/3/28 |

OTHER PUBLICATIONS

Abstract—2001 Derwent Info Ltd Dec. 7, 2001.

* cited by examiner

Primary Examiner—Cathy Lam
(74) Attorney, Agent, or Firm—Melanie G. Gover

(57) ABSTRACT

A composition for electrophoretic deposition of an insulating, protective coating. The composition comprises a cationic resin emulsion; and a curative mixed with the cationic resin emulsion. The composition after electrophoretic deposition and curing provides the protective coating that has a concentration of extractable ionic contaminants less than about 200 nanograms/cm$^2$; and a concentration of labile components less than about 36,000 nanograms/cm$^2$. A coating composition according to the present invention provides an article in the form of a flexible printed circuit, used as an interconnect, comprising a film substrate and a plurality of conductive traces adjacent to a surface of the film substrate to receive the insulating protective coating using electrophoretic deposition techniques.

9 Claims, No Drawings

US 6,803,092 B2

SELECTIVE DEPOSITION OF CIRCUIT-PROTECTIVE POLYMERS

FIELD OF THE INVENTION

This invention relates to coating formulations and a method, useful in microelectronics applications, for isolating and protecting fine-pitch, electrically conducting circuit interconnects, and related structures. More particularly the invention provides coating materials for application to conductive elements using an electrophoretic deposition technique. The coatings are non-contaminating, low-outgassing, and protective, having high resistivity and low dielectric constant. Optionally, the coatings provide negative image bearing layers after exposure to radiation patterns of suitable wavelength, followed by development with mild aqueous acid solutions.

BACKGROUND TO THE INVENTION

Modern society relies upon the trouble-free conveniences provided by electrical and electronic devices. Since the earliest recognition that useful devices could be developed by combining electrical circuits, circuit combinations have become more complex, and the resulting devices more sophisticated in their capabilities. Effective circuit performance relies upon electrical current isolation within a particular circuit with no possibility of current leakage into a neighboring circuit. Any unintended current transfer between circuits of a multi-circuit, multi-function electrical device will ultimately cause an inconvenient malfunction of the device.

Isolation or insulation of circuits from each other represents an increasing challenge with the continuing emphasis on more complex printed circuit designs and increased functionality for electrical devices, especially miniature electronic devices. Progress in electrical device design has caused a transition from the interconnection of discrete electrical components, using pre-insulated wiring structures, to interconnection, with modern printed circuits, using conductive traces only microns wide. Protection and isolation of such narrow traces, from each other, demands materials that may be precisely placed over the elongate current carrying traces while leaving tiny contact points exposed for electrical connection to other circuits that form part of a particular device. For a significant period of time it was possible to essentially cover the printed circuit with a protective coating, leaving voids in the coating corresponding to the needed points of contact. More recently, however, the introduction of flexible printed circuits and multi-layer printed circuits has led to the need for coatings and processes capable of high precision in protective cover formation and placement. High precision techniques provide a cover-layer with essentially just sufficient insulation to protect a conductive trace without straying into other portions of a printed circuit substrate. Such coatings tend to be very thin and subject to attack by, e.g. solvents, moisture, or other potentially damaging environments. For this reason, precision coating of printed circuits requires both insulative and environmental protection for electrical conductors.

A variety of coating methods exists for applying coatings, covercoats and the like as protective, insulating coatings to printed circuit patterns. The term covercoat refers to a dielectric coating, over the printed circuit basestock, applied after the conductive circuit pattern has been fabricated. The covercoat serves to protect the conductive traces from moisture, contamination and damage. Conventional coating methods include screen printing and application of continuous layers by methods such as knife coating, spin coating, extrusion coating, dip coating, curtain coating, and spray coating. Application of continuous coatings covers not only the leads but also the area in between the leads. This condition has several disadvantages when found in intricately structured printed circuits. For example, differences in expansion coefficients between a continuous cover-coat and a flexible printed circuit substrate may introduce stresses that cause the circuit to adopt an inconvenient curl-set. Segmentation of a cover-coat, into separate coated areas, is less likely to be subject to this condition.

Selective deposition processes, such as electrophoretic deposition, also known as "e-coat," may achieve coating separation and precise positioning (details of this process may be found in the "Handbook of Electropainting Technology" by W. Machu, Electrochemical Publication Limited, 1978). Application of electrophoretic deposition techniques began at least three decades ago for painting automobiles and appliances. Electrophoretic deposition involves precise distribution of a layer of charged droplets over a conducting surface that represents an electrode of an electrolytic cell operating under direct current potential. Charged droplets migrate towards an oppositely charged electrode to be deposited thereon. Droplet deposition and layer formation may occur at either an anode or a cathode. Preferably the droplets are positively charged for deposition on a cathodic surface. Cathodic coatings do not suffer the oxidative corrosive processes associated with anodic deposition. Also, electrophoretic deposition of water-based compositions produces essentially void free and substantially non-polluting coatings.

Compared to conventional coating processes, such as screen printing, electrophoretic deposition selectively places a protective layer only on conductive portions of the printed circuit. Use of electrophoretic deposition should produce individually encapsulated conductors, whereas conventional techniques coat the entire printed circuit. Selective deposition also offers other advantages, such as the production of lighter weight circuits which is important for hard disk drive (HDD) flexible circuits applications. Japanese published application JP 2000004072 describes a method for selectively exposing a connective portion of a circuit structure on the rigid metal surface of a magnetic head suspension arm. This reference uses electrodeposition of resins selected from polyimide or acrylic or epoxy resins to mask parts of a circuit structure during application of photoresist material. Imaging of the photoresist identifies, after development, parts of the circuit from which the electrodeposited covering will be etched to expose bare metal for contact points. There is no evidence to show that electrodeposited coatings are required to protect against moisture and contaminants. Also there is no need that the electrodeposited coatings are flexible coatings since they are substantially prevented from flexing by the support of the underlying aluminum suspension arm.

Selected electrical connector contacts on a flexible support may be electrophoretically coated with a blend of a polyethylene ionomer emulsion and an epoxy ester polymer emulsion, according to U.S. Pat. No. 3,892,646. Coating deposits may be thermally coalesced but are non-crosslinking. Electroconductive adhesives may be electrodeposited over fine circuit patterns to facilitate connection to other substrates preferably having electroconductive patterns, as described in U.S. Pat. Nos. 4,676,845 and 4,844,784.

The use of electrophoretic deposition is known for coating printed circuits with photoresists. U.S. Pat. Nos. 4,845,012;

4,877,818; 5,055,164; 5,607,818; 5,384,229; 5,959,859; and 5,439,774 contain reference to the technique. Other U.S. Pat. Nos. 4,592,816 and 5,181,984 describe epoxy/acrylate compositions for electrophoretic deposition of solder mask/covercoat systems. Photoresist and solder mask materials are typically photosensitive and developable to a patterned polymer covering selected (imaged) portions of the printed circuit. This provides evidence of photoimageable coatings, formed by electrophoretic deposition. Additionally, U.S. Pat. No. 4,832,808 teaches electrophoretic deposition of coatings of piperazine-containing polyimides. However, such coatings possess neither photosensitivity nor solubilization in aqueous acid developers.

The effective use of electrophoretically deposited, optionally photoimageable, coatings may depend upon the image resolution attainable with such systems. Printed circuits of increasing density require the use of photoresists of increasing image resolution. Image resolution depends upon radiation scattering within photosensitive layers and the variation of image characteristics, i.e. resolution, related to developers and development processes.

Polyimide-containing formulations provide potentially useful materials for photoimageable coatings produced by electrophoretic deposition. They also have the thermal and dielectric properties suitable for protecting and insulating electrical current carrying conductors. Image development of polyimide coatings, after exposure to an image pattern, may involve non-aqueous, solvent-based developers or aqueous-based developers. The use of solvent-based development systems applies to photoimageable polyimides that may use a benzophenone moiety as a built-in photo-crosslinker. U.S. Pat. Nos. 4,629,685; 4,656,116; 4,841,233; 4,914,182; 4,925,912; 5,501,941; 5,504,830; 5,532,110; and 5,599,655; and European Patent No. EP 0456463 A2 provide evidence of autosensitized polyimides.

Little attention has been given to an area of growing importance wherein a flexible interconnect carries signals to a magnetic transducer, located on a slider supported by a load beam within a hard disk drive (HDD). U.S. Pat. No. 6,046,886 refers to problems with the use of cover dielectric layers that may be used to insulate copper traces of a flexible interconnect. This reference further emphasizes the benefits of eliminating cover coat layers to avoid chemical incompatibility from outgassing and contaminating extractables such as silicones and ionic contaminants. Another problem with the application of cover coat layers to flexible circuits is the potential mismatch of thermal expansion coefficients between a cover coat and a flexible substrate used to support conductive circuit traces. Due to the continuous nature of cover coat layers, any mismatch of thermal expansion could cause the flexible circuit interconnect to develop an undesirable curl-set.

Considering the disadvantages of previously discussed cover coated flexible interconnects for hard disk drive applications there is a need for a coating to protect conductive traces using a process that avoids problems of curl and chemical incompatibility.

SUMMARY OF THE INVENTION

The present invention provides polymeric coatings applied to conducting structures, such as thin-film printed circuits, from emulsion or solution formulations using electrophoretic deposition preferably cathodic electrophoretic deposition techniques, also referred to herein as cataphoretic deposition. A coated thin film supported circuit, suitable as a HDD interconnect according to the present invention, is electrically insulated, exhibits minimal curl, and is minimally outgassing. It has flexibility similar to the thin-film supporting layer, may be imageable and may be formulated and cured such that electrical connections can be made through the coating by appropriate soldering techniques. A post-process to image holes through the coating may comprise laser ablation. Optionally, such coatings may function as image recording materials that respond to exposure to a pattern of suitable radiation. An image, formed in a coating according to the present invention, may be revealed using an acidified aqueous developer.

Coating compositions according to the present invention may comprise a variety of polymeric materials including polyimides, epoxy, acrylics, etc., especially those using epoxy chemistry. Electrophoretic deposition techniques require water-based coating formulations that are relatively benign environmentally. Suitable emulsion formulations include ionic species that are preferably positively charged to allow precipitation at cathodic surfaces represented by the conductive traces of a thin-film printed circuit. After deposition and curing, appropriately formulated coatings, based on epoxy or epoxy/acrylate chemistry have glass transition temperature (Tg) values in the range of 75° C. to 200° C. and preferably between about 100° C. and about 160° C.

Versatile coating compositions according to the present invention may be formulated and manufactured to satisfy a number of different applications. For example, coatings may be deposited so that they do not cure, or only partially cure after deposition and coalescence or after coalescence and UV exposure. Such coatings may be penetrated relatively easily to form electrical through-connection, such as by soldering. Alternatively, coatings may be formulated to have latent curing characteristics. A thermally cured material provides one type of latent curable coating composition that may be deposited in an uncured state before heating to a final cured condition. As needed, an electrical connection may be provided to underlying conductive circuit traces by soldering through the latent curable deposit, which may then be cured by exposure to a source of thermal radiation.

Latent curing may also be achieved using, e.g. a photo-crosslinkable coating composition exposed to a suitable form of radiant energy, such as ultraviolet radiation. The use of latent photo-cure provides not only the benefit of soldering through an uncured coating, as discussed previously, but also allows selective placement of protective insulating material following photo-curing and development according to imagewise exposure to appropriate radiant energy. This could provide "connection pads" positioned appropriately for soldering in the normal sense. Control of cross-link density may provide coatings suitable for forming through-soldered connections even after photo-cure.

Another possible combination of latent curing characteristics involves coating compositions that have been formulated to cure in response to both radiant energy and heat. This provides a photo-imageable and developable coating that has optimum cured resin performance upon heating.

Methods for cathodic deposition of coatings include batch and continuous processes. An electrophoretic deposition cell facilitates batch processing of individual circuits using a container for a water-based coating formulation that is stirred to maintain uniformity. The cell has an anode, in the form of a stainless steel counter-electrode, and a cathode, both being connected to a regulated DC power supply. Preferably, the cathode comprises a thin film circuit designed with interconnection or "bussing" of metal traces to facilitate deposition of material on all portions of the circuit that require coating. Voltage applied to the cell, after lowering the anode and cathode into the coating formulation, causes coating to deposit on electrically connected portions of the thin film circuit. It is not necessary to regulate the current, which initially peaks to a certain value before dropping due to the insulating effect of the depositing coating. Voltage applied for times ranging from a few seconds to a few minutes may be as low as 5 volts or less, or as high as 100 volts. Following deposition and rinsing with deionized water, the particulate deposit may be coalesced to a smooth coating by heating for several minutes at elevated temperature. The coating can then be subjected to any of the cure methods described above.

Alternatively, the coating may be deposited in an in-line, continuous process that uses a insulating film support web that has multiple printed circuits formed over its surface. In this case, appropriately "bussed" circuits maintain electrical continuity along the web, between individual circuit elements. The coating apparatus allows threading of the circuit supporting web from an unwind station through an electrophoretic deposition cell to a wind-up station. Printed circuits according to the present invention typically include a polyimide thin film support for electrically insulated circuit traces. Preferably the thin film is Kapton E and the circuit traces may be formed using copper alone or copper that has been electrocoated with gold. As the moving web passes through the deposition cell an electrical current carrying roller makes connection with the circuit metal traces to apply a voltage causing coating to deposit on electrically connected conductive traces. Other rollers in the web guidance system are suitably insulated to prevent inadvertent coating deposition. There is no need to control applied current since the thickness of the insulating coating composition is current limiting as described previously. After in-line rinsing, the coated circuits may be coalesced at elevated temperature by exposure to an infrared heater or contact of the backside of the web with a hot surface, typically in the form of a hot can. The coalescence step may be delayed since the deposited coating is inherently a solid and suitable for wind-up into a roll for future processing. It is conceivable to add additional processing stations to process thin film circuits, in web form, for thermal curing, photo-curing and selective development of imaged sections of deposited coatings.

One use of photoimageable polymers, including photosensitive epoxy-based polymers, is the precise electrophoretic deposition of protective, electrically insulating coatings over conductive parts of a printed circuit pattern, followed by imagewise exposure and development. The process of development uses aqueous acid or aqueous acid/coalescing solvent mixtures to remove the coating from those parts of the circuit that provide points of connection to other circuits or electrical devices. Acidified aqueous developers offer advantages over solvent and aqueous alkaline developers by preventing problems of copper corrosion and copper oxide formation.

More particularly the present invention provides a composition for electrophoretic deposition of a protective coating. The composition comprises a cationic resin emulsion and a curative mixed with the cationic resin emulsion. The composition after electrophoretic deposition and curing provides the protective coating that has a concentration of extractable ionic contaminants less than about 200 nanograms/cm$^2$; and a concentration of labile (outgassing) components less than about 36,000 nanograms/cm$^2$.

The present invention further includes an article in the form of a flexible printed circuit, used as an interconnect comprising a film substrate having a thickness from about 0.01 mm to about 0.25 mm. A plurality of conductive traces is adjacent to a surface of the film substrate to receive an insulating coating deposit on the plurality of conductive traces by electrodeposition techniques. The insulating coating comprises a cured polymer composition having a concentration of extractable ionic contaminants less than about 200 nanograms/cm$^2$; and a concentration of labile (outgassing) components less than about 36,000 nanograms/cm$^2$. Also the flexible printed circuit has a bend radius below 3 mm without damage to the insulating coating.

A method for forming an insulating coating on conductors of a flexible circuit, according to the present invention, comprises the steps of initially providing a flexible circuit including at least one conductor. The conductor is available for connection to a DC power supply such that the conductor becomes a negatively charged conductor. The negatively charged conductor is immersed in a composition comprising a cationic resin emulsion mixed with a curative. An electric current is then passed through the negatively charged conductor to cause electrophoretic deposition of the composition on the surface of the conductor. Curing of the deposited composition provides the insulating coating that has a concentration of extractable ionic contaminants less than about 200 nanograms/cm$^2$; and a concentration of labile (outgassing) components less than about 36,000 nanograms/cm$^2$. These properties satisfy the requirements of electronics-grade cleanliness.

Electrophoretic deposition techniques allow relatively precise placement of material on charged surfaces included in an electrolytic cell, operated by direct current. The charged surfaces could include suitably connected printed circuits to induce material placement on individual metal traces of the circuitry. Using electrophoretic deposition techniques, deposition of material occurs predominantly on conductive surfaces. This facilitates the coating of unsupported leads and relatively inaccessible portions of a printed circuit such as conductive traces disposed within the structure of a multilayer circuit. Traditional coating methods do not provide desirable protection for such features. In addition, precision coating via electrophoretic deposition techniques uses less material than traditional coating methods thereby providing beneficial cost savings and waste reduction. The selective placing of electrophoretically deposited films provides an added advantage, for coating flexible printed circuits, compared to blanketing covercoat layers produced with conventional coating methods. Regardless of differences in coefficient of thermal expansion, selectively deposited coatings cannot exert a force to distort the general shape of the flexible substrate material. Flexible circuits, coated using electrophoretic deposition, are lighter and less likely to exhibit cure-stress-induced curl after processing. Lower circuit weight is important for certain applications, such as interconnects for hard disk drives.

Definitions

For clarification, the following definitions provide the meaning of terms that may be used throughout this specification.

The term "covercoat" refers to a substantially continuous dielectric coating, over the basestock, applied after the conductive pattern has been fabricated. The basestock may be a conventional printed circuit substrate, including flexible polyimide sheet, used as a support for etched metal patterns, particularly those formed by etching copper.

The terms "epoxy-based polymer" or "polyepoxy-based polymer" or "polyepoxide-based polymer" may be used interchangeably to refer to the product of a reaction involving monomers and oligomers having reactive epoxy substituents.

Use of the term "bis-maleimides" herein refers in general to the reaction product of maleic anhydride with an aliphatic diamine, or an aromatic diamine, or an alicyclic diamine or any combination thereof.

The term "current density" means the amount of current flowing through a substrate, per unit area, perpendicular to the direction of current flow.

The term "e-coat" is synonymous with electrophoretic deposition and may refer herein to a coating, and technique for electrophoretically depositing such a coating.

The term "emulsion" refers to polymer containing fluids used for electrophoretic deposition of protective coatings on electrically conducting surfaces.

Use of "electronics-grade cleanliness" herein means that selectively-coated, thin-film supported circuits according to the present invention satisfy electronics industry requirements to limit amounts of labile or fugitive components to low levels of outgassing and extractable contaminants and absence of tin and silicone species.

The term "through-soldering" refers to the facility for making an electrical connection to a conductive circuit trace through a layer of a protective coating composition. Depending upon the final properties of the coating, a through-soldered connection may be formed before or after curing of a coating, preferably an electrophoretically deposited coating.

Use of the term "laser ablation" refers to a means for providing access to bare conductors of a printed circuit using laser energy to produce openings in a coating over the conductors. The laser ablation method provides holes as access channels for electrical connection of underlying conductors to electronic components and devices, e.g. by soldering.

The use of the term "selective" reflects substantial restriction of protective coating to only those portions of a printed circuit that are electrically conductive. Advantages of selective coating include weight reduction, the use of less material and significantly less induced curl than conventional coating methods.

The term "unsupported lead" means a conductive trace or lead positioned adjacent to but not necessarily supported by the insulating substrate of a flexible circuit. An example of an unsupported lead is one that spans a void in a substrate or extends over the edge of a substrate and thereby exists in an unsupported condition.

Conductive leads or traces "adjacent" to an insulating support or substrate may include those in contact with the support or those in the vicinity of the support without contacting the support, or both.

The term "aqueous acid soluble polymer" refers to a polymer that is at least partially soluble in aqueous acid solutions.

The term "aqueous acid developable polymer" refers to a photoimageable, aqueous acid soluble polymer crosslinked by exposure to suitable radiation so that crosslinked material no longer dissolves in dilute aqueous acid. This allows dissolution of unexposed material to leave an insoluble pattern of crosslinked material corresponding to the pattern of radiation used for exposure.

The term "coalescing solvent" refers to a class of solvents that are water soluble as well as oil soluble. These solvents, e.g. 2-butoxyethanol (butyl cellosolve), facilitate the coalescence of the coating after deposition.

The term "resin solvent" refers to a class of solvents that are substantially water insoluble but in which the cataphoretic resin is soluble. Solvents such as xylene, mixed xylenes, toluene, iso-amyl ketone, methyl iso-butyl ketone and the like facilitate the processing of cataphoretic resins.

Concentrations expressed as percentages (%) signify weight percent (wt. %) unless otherwise indicated.

DETAILED DESCRIPTION OF THE INVENTION

The present invention provides selectively-applied, protective coatings for conductive traces of flexible printed circuits, particularly flexible interconnects to electrically couple a magnetic transducer, located on the slider of a hard disk drive, to the electronic circuitry of the disk drive. Application of protective coatings according to the present invention uses electrophoretic deposition, sometimes referred to as cataphoretic deposition. This deposition technique applies a coating layer only to those conductive traces of a flexible circuit that carry electrical current provided by a direct current power supply included as a component of an electrophoretic deposition cell. After coalescence and curing with radiant energy, thermal energy or a combination thereof, coatings according to the present invention are substantially free of labile, outgassing products and chemical contaminants including ionic contaminants and particularly silicone and tin contaminants. Such performance is desirable for coating materials that may be used to cover internal components of hard disk drives. In addition the use of electrophoretic deposition places coating composition on, but not between, conductive features of a flexible printed circuit. This avoids protective coating continuity that could otherwise induce curl due to a mismatch of the thermal expansion characteristics of the coating and the substrate supporting the conductive traces of the printed circuit.

Materials suitable as electrically insulating protective layers for delicate, fragile conductive traces according to the present invention include silicone-free epoxy-based polymer compositions and polyimide compositions with the use of epoxy-based polymers being preferred. Epoxy-based polymers are formed such that they have a high Tg without excessive crosslinking. This provides a coating with improved flexibility but still having high temperature performance. The resultant materials may be applied using electrophoretic selective deposition techniques. The use of the term "selective" reflects substantial restriction of protective coating to only those portions of a printed circuit that are electrically conductive. Deposited polymers preferably form coalesced, continuous, protective layers at elevated temperatures. The layers, after coalescence, may be further cured to a hardened coating by thermal curing, or photo-curing or a combination of the two. Coating hardness may be expressed in terms of pencil hardness exemplified by a range from soft to hard of 6B to 5H. Optionally, coating compositions according to the present invention may include photoimageable polyepoxy-based compositions capable of image-wise development. This type of coating, after image-wise exposure, provides further selective control of the area of a conducting trace to be covered for electrical insulation and protection from contamination.

Examples of preferred epoxy polymers according to the present invention include products of reactions of the diglycidyl ether of bis-phenol A (EPON 828 available from Resolution Performance Products or as DER 331 from Dow Chemical Company) and substituted fluorene monomers including fluorene bis-phenol, i.e. 9,9-bis (4-hydroxy phenyl) fluorene and bis-cresol fluorene, i.e. 9,9-bis (4-hydroxy-3-methyl phenyl) fluorene. Controlled reaction of these materials produces oligomers having a substantially linear structure that includes a fluorene moiety. Other constituents may replace the preferred fluorene moieties discussed previously including bis-N-methyl amino phenyl fluorene, i.e. 9,9-bis(4-methylamino phenyl) fluorene, or phenolphthalein or any moiety that raises the Tg of a curing system as described in U.S. Pat. No. 4,822,464 (column 2 lines 36–48). The ratio of Tg enhancing monomer (e.g. fluorene bis-phenol) to co-monomer (e.g. EPON 828) is determined by the desired Tg of the coalesced coating and of the cured coating. The larger the amount of the fluorene moiety in the cataphoretic resin, the higher will be the Tg of the coalesced coating and also the cured coating. A coating resin may substantially comprise fluorene-based monomers. For example, reaction of 9,9-bis(4-glycidoxy phenyl) fluorene with 9,9-bis(4-hydroxy phenyl) fluorene yields a coating composition exhibiting a Tg in excess of 160° C. Selected combinations of 9,9-bis(4-glycidoxy phenyl) fluorene, 9,9-bis(4-hydroxy phenyl) fluorene, the diglycidyl ether of bis-phenol A, and bisphenol A itself provide resins within a Tg range.

Coatings of epoxy-based resins include components that facilitate electrophoretic deposition and subsequent crosslinking and curing. Structures containing a bis-maleimide molecule provide one means for thermally crosslinking coatings according to the present invention after cataphoretic deposition. Use of the term bis-maleimides herein refers in general to the reaction product of maleic anhydride with an aliphatic diamine, or an aromatic diamine, or an alicyclic diamine or any combination thereof. Examples of diamines include hexamethylene diamine, methylene di-aniline, isophorone diamine, p-phenylene diamine, o-phenylenediamine, diaminodiphenylsulfone and the like with aromatic diamines such as diaminodiphenylsulfone being preferred. These bis-maleimides are solids that may be dispersed into a coating formulation by grinding in the presence of cationic resins derived from the epoxy oligomers discussed previously.

An alternative thermal crosslinking agent to a bis-maleimide moiety is a blocked isocyanate, which in this invention should be a completely blocked polyisocyanate having at least two isocyanate groups in the molecule. As a further requirement the blocked isocyanate is preferably water insoluble and oil soluble. The coating formulation of this invention requires that it contain no catalyst for unblocking the isocyanate. Such catalysts remain in the coating after cure and may contribute to undesirable outgassing or other contaminating species that could deposit on interior portions of electronic devices such as hard disk drives. The unblocking reaction, when required, is preferably a heat-responsive reaction occurring below 250° C. and preferably in the range of 150–250° C.

Suitable examples of isocyanates include aliphatic diisocyanates, alicyclic diisocyanates and aromatic diisocyanates. Representative aliphatic diisocyanates include hexamethylene diisocyanate, trimethylene diisocyanate, tetramethylene diisocyanate, dimeric acid diisocyanates, lysine diisocyanate and the like. Exemplary alicyclic diisocyanates include isophorone diisocyanate, methylenebis(cyclohexyl isocyanate), methyl cyclohexane diisocyanate, cyclohexane diisocyanate, cyclopentane diisocyanate, and the like. Suitable aromatic diisocyanates include xylylene diisocyanate, tolylene diisocyanate, diphenylmethane diisocyanate, naphthalene diisocyanate, toluidine diisocyanate and the like, urethanated adducts biuret type adducts, isocyanuric ring type adducts or like modified products of these polyisocyanates. Preferred polyisocyanates include aromatic and alicylic polyisocyanates, e.g. isophorone diisocyanate, or a polyisocyanate based upon the trimerization of hexamethylene diisocyanate.

Blocking agents for blocking isocyanate groups of these compounds are, for example, phenol compounds, lactam compounds, active methylene compounds, alcohol compounds, mercaptan compounds, acid amide compounds, imide compounds, amine compounds, imidazole compounds, urea compounds, carbamic acid compounds, imine compounds, oxime compounds and the like.

Coating formulations according to the present invention may also include polyfunctional, free-radically polymerized acrylic monomers with preferred monomers including three or more functional groups. Exemplary acrylate and methacrylate substituted polyfunctional monomers include pentaerythritol triacrylate, pentaerythritol tetraacrylate and trimethylolpropane trimethacrylate. These polyfunctional monomers contribute to either thermal curing or photocuring of coalesced coatings after electrophoretic deposition.

Known photoinitiators for photosensitive epoxy coating formulations according to the present invention may be primarily oil-soluble materials as listed in the Kirk-Othmer Encyclopedia of Chemical Technology, Fourth Ed., Vol. 20, New York, 1996, p. 850 and selected from the group consisting of benzophenone, halogenated bezophenones, amino functional benzophenones (e.g. Michler's ketone), fluorenone derivatives, anthraquinone derivatives, xanthone derivatives, camphorquinone, benzil, diphenoxy benzophenone, alkyl ethers of benzoin, benzil dimethyl ketal, alpha-hydroxyacetophenone, 1-hydroxy-2-methylphenol-1-propanone, 2,2 diethoxyacetophenone, 1-phenyl-12-propanedione-2-ethoxy-carbonyl)oxime, 2-methyl-1-(4-methylthio)phenyl)-2-morpholino propanone-1,2-benzyl-2-N,N-dimethylamino-1-(4-morpholinophenyl)butanone, alpha-amino acetophenones, halogentated acetophenone derivatives, sulfonyl chlorides of aromatic compounds, acylphosphine oxides, bis-acyl phosphine oxides, bis-imidazoles and the like.

Electrophoretic deposition occurs by migration of charged particles or droplets present in the electrolyte of an electrochemical cell. Application of a potential difference to the cell causes charged particles to migrate to the electrode of opposite charge where charge neutralization, on the conductive surface, causes material to deposit and coat the electrode. Electrophoretic coating, according to the present invention, requires the application of direct current and coating deposition at the negatively charged electrode, or cathode. This may also be referred to herein as cataphoretic coating. Specifically, the polymer is deposited from an emulsion or solution bath containing some amount of solvent soluble polymer dispersed in an aqueous dispersion phase. As discussed herein, electrophoretically depositable emulsions or solutions include a polymer composition dispersed in an appropriate medium or carrier. The carrier comprises water and a coalescing solvent. With current flowing between electrodes immersed in the solution or emulsion bath, particles or droplets of the dispersed phase begin preferential migration towards the electrode of opposite charge.

Aqueous acid solutions, suitable for developing polymeric compositions, according to the present invention, may be selected from acetic acid, ethoxyacetic acid, propionic acid, butyric acid, lactic acid, glycolic acid, formic acid and succinic acid and mixtures thereof. The developing solution may also contain a coalescing solvent such as butyl cellosolve to aide in the dissolution of the uncrosslinked polymer and improve the definition of the retained features.

After drying an electrophoretically deposited photosensitive epoxy coating at approximately 100° C. to 150° C., an image may be formed by exposing the coating to a pattern of ultraviolet radiation. The photoimaging process occurs via crosslinking exposed areas of the polymer layer using a photo-mask between the coating and a broadband ultraviolet lamp. Photoimaged, crosslinked polymer no longer dissolves in dilute aqueous acid solution. Image patterns, corresponding to the photo-mask, may be developed by dipping the imaged coating in a solution containing from about 0.1% to about 10% of acetic acid in water, or in a water/butyl cellosolve mixture. This removes the unexposed, non-crosslinked polymer that is still soluble in aqueous acid or other suitable developer. After acid development, the developed image, corresponds to the pattern of ultraviolet radiation. This image may be fixed by curing at about 275° C., preferably at about 250° C.

Electrophoretic depositable coating formulations containing polyimides may be cured at about 300° C., preferably at about 350° C., in a nitrogen filled oven. The heating rate and dwell time at the curing temperature require relatively careful control. A positive nitrogen pressure prevents oxidation of the film during curing. The use of a slow rate of heating, to the final curing temperature, allows volatile products to escape before the polyimide cures fully. A controlled heating rate also prevents foaming and film delamination. Coatings heated to temperatures as indicated above are unlikely to retain fugitive chemical contaminants or outgassing materials. Circuits coated with such polyimide material should meet performance requirements for use in HDD assemblies.

Electrophoretic deposition of polymers on conductive surfaces provides a relatively precise approach for covering and protecting fragile leads including unsupported leads used for electrical interconnection in high density printed circuits including flexible circuits. Materials applied in this way have potential application as barrier coatings to provide abrasion resistance and electrically insulating protective layers for product applications in areas such as integrated circuit packaging (ICP), ink jet printers, hard disk drives, medical and biomedical equipment and automotive applications.

Preparation of Epoxy-based Cataphoretic Materials

This method uses the composition of Example 1 (Table 1) to provide a general method for preparing cataphoretic compositions containing modified epoxy polymers suitable for electrophoretic deposition. This description also includes an alternative embodiment in which the cataphoretic coating is made photosensitive. The remaining cataphoretic coating compositions (described in Table 1) were made by processes similar to that described below.

Synthesis of Fluorene-bis-Phenol-Epoxy Oligomer

Material composition (Example 1):

| | |
|---|---|
| bis-Phenol fluorene (Monomer "F," MW 350.42) | 75.7 g |
| EPON 828* (MW 375) | 129.6 g |

*EPON 828 is a bis-Phenol A epoxy material available from Resolution Performance Polymers.

The reactants were added to a resin flask equipped with a metal stirrer, a vacuum chuck and a vacuum connection. After evacuation, the resin flask was heated to a temperature of 180° C. using a temperature controlled oil bath. The contents of the resin flask melted as the temperature increased. Upon attainment of 180° C., the mixture was stirred at reduced pressure for one hour. At the end of that time, the pressure was adjusted to atmospheric pressure just long enough for the rapid addition of 0.65 g of triethylphosphonium bromide to the stirred contents of the resin flask. Thereafter the resin flask was evacuated to promote reaction between the epoxy and fluorene-containing materials while minimizing side reactions that could occur if water was present. During stirring for a period of three hours at 180° C. there was a noticeable increase in the viscosity of the mixture.

The reaction flask temperature was reduced to 125° C. The vacuum attachment was removed and replaced by a water-cooled condenser. An amount of 75.0 g. of mixed xylenes was added and the reaction continued, with stirring, at atmospheric pressure for 1.5 hours at 125° C. This yielded a reaction product that was cooled, transferred to a glass jar, and quickly covered to protect it from the environment. The reaction product had an epoxy equivalent weight of 1020 g/equivalent.

Synthesis of Cationic Resin Emulsion

The reaction product described previously was diluted with mixed xylenes in a resin flask equipped with a metal stirrer and condenser, using a ratio of 100 g of reaction product to 10 g mixed xylenes. A temperature controlled oil bath was used to raise the temperature to 80° C. The contents of the flask were stirred for thirty minutes at this temperature, during slow, dropwise addition of 8.3 g diethanolamine from a dropping funnel. The reacting mixture was stirred for one hour before rinsing the dropping funnel with a aqueous solution of 12.5 g butyl cellosolve and 10 mls deionized water to collect residual diethanolamine for addition to the reaction flask. After stirring for a further two hours at 80° C., a quantity of 8.2 g of 85% lactic acid in water was added from a dropping funnel, over a period of thirty minutes. Residual lactic acid was rinsed from the dropping funnel as before using the solution of aqueous butyl cellosolve, which was then added to the reaction flask. The resin flask contents were heated at 80° C. for one hour then cooled to 50° C. A volume of 50 ml of deionized water was added with stirring. The resulting resin emulsion may preferably be stored in a glass jar. The solids content of this emulsion was 45.4%.

Thermal Crosslinker (bis-Maleimide) Preparation

Separately a ball mill jar and a number of 1.0 inch radius ceramic cylinders were thoroughly cleaned with deionized water, before placing the ceramic media inside the mill jar. A mixture of deionized water and detergent was added to the ball jar, which was then rotated on a two-roll mill for several hours. The cleaning solution was removed from the ball jar before rinsing and flushing thoroughly to remove any traces of detergent.

A quantity of 100 g of the bis-maleimide of diaminodiphenyl sulfone (MATRIMID 5292B available from Vantico Corporation (formerly Ciba-Geigy Resins) was mixed in a beaker with 11 grams (5 g. of solids) of the previously prepared cationic resin emulsion and added to 200 g deionized water in the clean ball mill. After sealing to prevent leakage of its contents, the ball mill was placed on a two-roll mill and allowed to rotate overnight. This process produced a milled product that was removed by opening the ball jar and emptying its contents, including the ceramic media, into a clean aluminum pan. The maximum possible amount of a ball-milled dispersion was decanted from the aluminum pan and the ceramic cylinders into a clean glass jar. The dispersion had a solids content of 32.3%

Preparation of Photosensitive Electrophoretic Coating Dispersions

A photosensitive electrophoretic coating dispersion according to the present invention comprises a mixture of a photoinitiator solution, a free-radically polymerizable, multi functional monomer, a cationic emulsion and a crosslinking dispersion, as described previously. Preparation of a preferred electrophoretic coating dispersion requires addition of 152.6 g of deionized water, with high speed stirring, to a mixture of 23.5 g of cationic emulsion (45.4% solids), 3.1 g of a crosslinking dispersion (32.3% solids) and 1.0 g pentaerythritol tetraacrylate (the free-radically polymerizable, multi-functional monomer) in a 12 oz glass jar. High-speed stirring conditions preferably require the use of a propeller-style blade.

Under red-light darkroom conditions, addition of 1.0 g of a photoinitiator solution imparted photosensitivity to the electrophoretic coating dispersion described above to provide a liquid composition of 7.1 wt. % solids content. The photoinitiator solution contained 2.1 g t-butyl anthraquinone dissolved in a mixture of 7.9 g of butyl cellosolve and 10.4 g mixed xylenes. The resulting photosensitive electrophoretic coating dispersion requires protection from light prior to use.

Coating Deposition and Curing

Electrophoretic coating was carried out under red light darkroom conditions using an Electronic Measurements Inc., TCR power supply operating at 20 volts. A suitable deposition cell included a reservoir to contain the electrophoretic coating dispersion, a means to stir the dispersion, a stainless steel anode and a cathode comprising a flexible circuit including conductive copper traces. The flexible circuit was cleaned by immersion in a 5% solution of sulfuric acid to remove any surface oxide. Residual acid was removed by rinsing with deionized water.

Electrical current flowing through the cell for about ten seconds deposited a coating only on the conductive traces of the flexible circuit. The coating was heated at 100° C. for two minutes to melt the crosslinking dispersion and coalesce the coating over the conductive traces. After cooling, a portion of the coalesced coating was exposed to ultraviolet radiation from an "H" bulb of an UV curing apparatus available from FUSION Systems Corporation (Rockville Md.). Another portion of the flexible circuit was masked during this exposure to allow comparison between exposed and unexposed material. Application of a solution containing 10% acetic acid in deionized water removed the unexposed portion leaving photocured material adhered to the portion of the conductive traces exposed to ultraviolet radiation. After a final rinse in deionized water, the photocured coating was heated for about one hour at 170° C. to thermally cure the remaining coating and bake it on to the selected conductive traces.

The coated circuit produced by electrophoretic deposition was flat, showing substantially no curl. There was also evidence to show strong adhesion of the coating to the conductive traces since the coated flexible circuit, when bent back upon itself, showed no delamination from the traces. While remaining highly flexible, coatings according to the present invention did not appear to contain any fugitive materials in the form of ionic or outgassing components.

EXAMPLE 2

A procedure similar to that described for Example 1 was used to provide a coating formulation free from the bismaleimide of diaminodiphenyl sulfone (MATRIMID 5292B). The resulting electrophoretic coating emulsions were deposited on both copper and gold electrocoated circuits using the continuous process described above. Coating conditions included an applied potential of 7 volts for copper traces and 5 volts for gold plated traces. The current draw was approximately 200 mA for a web speed of 6 ft/min. Deposited material was coalesced in line at 150° C. (303° F.). The coalesced coating was photocured off-line to a hardness of 3H by exposure to 14 mJ/m$^2$ of ultraviolet radiation. Flexible coated circuits exhibited no detectable curl and withstood a zero radius bend without delamination.

EXAMPLE 3

A procedure similar to that described for Example 1 provided an emulsion for electrophoretic coating of conductive traces, in which the bis-cresol of fluorene (Monomer BCF) replaced the bis-phenol of fluorene (Monomer F) in the substituted fluorene epoxy oligomer. The resin had an epoxy equivalent weight of about 990. In addition, the pentaerythritol tetraacrylate crosslinker, of Example 1, was replaced by DESMODUR BL 3175A (available from Bayer Corporation). This provides a thermally crosslinkable material that is not photoimageable. The resulting electrophoretic coating emulsion was deposited on copper circuits using the continuous process described above. Coating conditions included an applied potential of 10 volts. The coating was coalesced on the coater at 132° C. and thermally cured at 240° C. for about 2 minutes. Although the coating appeared substantially uniform, there was evidence of circular voids caused by residual copper oxide on the copper circuits. Careful cleaning procedures remove these voids. Cured coating had a pencil hardness of H and coated circuits were flexible enough to survive a zero degree radius bend test. The printed circuit showed no evidence of curl and soldering through the coating established electrical connection to an underlying metal trace.

EXAMPLE 4

A procedure similar to that described in Example 1 provided an emulsion for electrophoretic coating of conductive traces. The pentaerythritol tetraacrylate crosslinker was replaced by an adduct of methyl ethyl ketoxime and hexamethylene diisocyanate to provide a thermally crosslinkable material. Coating emulsions were deposited on copper circuits using the continuous process described above. The coating was applied at a potential of 7 volts, with a current draw of approximately 200 mA, for a web speed of 6 ft/min. After rinsing and air drying, the web supporting the coated circuits was wound on a reel using a polyester interleaver. At this point in the process the coatings had not been coalesced. The coalescence operation was performed separately by heating coated circuits to 100° C. for one minute. Subsequent heating at 255° C. for about one minute produced the final cured coating having a pencil hardness of F. The resulting coated flexible circuit showed no evidence of curl and withstood bending at a zero radius bend without delamination.

TABLE 1

Coating Formulations

| Materials | Example 1 | Example 2 | Example 3 | Example 4 |
|---|---|---|---|---|
| Cationic Resin 1 | 5.93% | 7.17% | | |
| Cationic Resin 2 | | | 4.56% | |
| Cationic Resin 3 | | | | 4.98% |
| Dispersion containing bis-maleimide | 0.56% | | | |
| Crosslinker A | 0.56% | 0.50% | | |
| Crosslinker B | | | 3.23% | |
| Crosslinker C | | | | 1.02% |
| Resin Solvent | 2.26% | 2.29% | 2.79% | 2.05% |
| Coalescing Solvent | 1.56% | 1.6% | 1.86% | 1.54% |
| Photoinitiator | 0.057% | 0.057% | | |
| Deionized Water | 89.1% | 88.4% | 87.55% | 90.4% |
| Applied Voltage | 20 volts | 5–7 volts | 10 volts | 7 volts |
| Deposition Time | 10 seconds | ~10 seconds | ~10 seconds | ~10 seconds |
| Coating Hardness | | 3H | H | F |
| Flatness | Excellent | Excellent | Excellent | Excellent |
| Flexibility - mandrel bend | No delamination with bend over itself | No delamination with bend over itself | No delamination with bend over itself | No delamination with bend over itself |
| Other features | Not solderable through coating after cure | Solderable through coating after photo-cure | Not solderable through coating after cure | Solderable through coating after cure. Could be rolled up on an interleaver for later curing |

Cationic Resin 1—Reaction product of the diglycidyl ether of bis-phenol A (EPON 828) with "fluorene bis-phenol" and diethanolamine, cationized with lactic acid, made as described in Example 1 and 2.
Cationic Resin 2—Reaction product of the diglycidyl ether of bis-phenol A (EPON 828) with "bis-cresol fluorene" and diethanolamine, cationized with lactic acid, made as described in Example 3.
Cationic Resin 3.—Reaction product of the diglycidyl ether of bis-phenol A (EPON 828) with "fluorene bis phenol" and diethanolamine, cationized with lactic acid, differing only in molecular weight from Cationic Resin 1.
Crosslinker A—Pentaerythritol tetraacrylate
Crosslinker B—DESMODUR BL 3175A
Crosslinker C—Reaction product of methyl ethyl ketoxime and hexamethylene diisocyanate.

Comparative Example C1

Coated flexible circuits of Example C1 were obtained by application to their surface of a commercially available, screen-printable covercoat designated as R/FLEX 8080LP5 and available from Rogers Corporation of Chandler, Ariz. R/FLEX 8080LP5 is an aqueous alkali-developable, liquid-photoimageable solder resist ink developed for flexible circuit boards. Final cure of photoimaged material may be achieved by heating according to manufacturer's specifications. This material is offered for use in hard disk drive applications.

Comparative Example C2

A modified R/FLEX 8080 screen-printable composition, also available from Rogers Corporation of Chandler, Ariz. was used for Examples C2. This covercoat material was applied and tested in the same way as Example C1.

Table 2 shows improved performance of the present invention compared with commercially available covercoats.

TABLE 2

Property Comparison

| Target Property | Example 2 ng/ cm² | Example C1 ng/ cm² | Example C2 ng/ cm² |
|---|---|---|---|
| Other Unknown Compounds | 4.0 ± 1.0 | 140.0 ± 1.0 | 33.0 ± 24.0 |
| Total Outgassing | 4.0 ± 1.0 | 150.0 ± 57.0 | 36.0 ± 28.0 |
| Total Target Anions | 19.0 | 52.0 | 78.0.0 |
| Sulfate | <6.4 | 52.0 ± 7.5 | 3.0 ± 5.0 |
| Lithium | <3.2 | <4.4 | <4.4 |
| Sodium | <13.0 | 190.0 ± 28 | 113.0 ± 7.4 |
| Ammonium | <16.0 | <22.0 | <22.0 |
| Potassium | <32.0 | <44.0 | <44.0 |
| Magnesium | <16.0 | <22.0 | <22.0 |

TABLE 2-continued

Property Comparison

| Target Property | Example 2 ng/cm² | Example C1 ng/cm² | Example C2 ng/cm² |
|---|---|---|---|
| Calcium | <32.0 | <44.0 | <44.0 |
| Coating Hardness | F-2H | HB | HB |
| Flatness | No curl | No curl | No curl |
| Flexibility (wire diameter) | No cracking with 0.0 mm bend | No cracking with 0.35 mm bend | No cracking with 0.25 mm bend |

Methods of Analysis

Water Extractable Ions

Samples of coatings were placed in deionized water and heated in an oven at 85° C. for one hour to provide solutions containing water extractable material. The solutions were analyzed for anions or cations using known Ion Chromatography techniques.

Determination of Labile (Outgassing) Products

Coating samples were outgassed in dynamic headspace oven-manifolds and the volatile materials collected by this method were analyzed by thermal desorption gas chromatography/mass spectrometry techniques.

Flexible Circuit Flatness Measurement

Flatness was measured using a flexible circuit approximately five centimeters in length. One end of the sample was taped to a flat surface. The other end of the sample was inspected for deflection that appeared as a measurable gap between the flexible circuit and the flat surface.

Measurement of Coating Hardness

Cured polymer films, deposited as covercoats on flexible circuits, exhibit good adhesion (ASTM D3359) and hardness that may be determined with respect to pencil hardness gradations, from soft to hard, of 6B, 5B, 4B, 3B, 2B, HB, F, H, 2H, 3N, 4H, 5H according to standard test method ASTM D3363.

Circuit Flexibility Measurement

The flexibility of flexible circuits, coated according to the present invention, was measured by wrapping a sample around wires of diminishing diameter until the coating showed evidence of cracking. Samples were tested with the coating facing either towards the wire mandrel or away from it. The latter, outwards facing, coating orientation represents the most severe test condition. Test results provide most severe bend, i.e. wrapping condition that samples were able to withstand without cracking, regardless of coating orientation. A 0.0 mm (zero) bend represents a test condition in which a coated sample is folded upon itself and held flat for about 5.0 seconds using an applied weight.

TABLE 3

Extractable Cations

| Target Cation | Example 2 ng/cm² | Example 4 Fully cured ng/cm² | Example 4 Coalesced ng/cm² |
|---|---|---|---|
| Li⁺ | <3.2 | ND | ND |
| Na⁺ | <13.0 | ND | 6.2 |
| NH₄⁺ | <16.0 | 14.0 | 13.0 |
| K⁺ | <32.0 | ND | ND |

TABLE 3-continued

Extractable Cations

| Target Cation | Example 2 ng/cm² | Example 4 Fully cured ng/cm² | Example 4 Coalesced ng/cm² |
|---|---|---|---|
| Mg²⁺ | <16.0 | ND | ND |
| Ca²⁺ | <32.0 | 19.0 | 23.0 |
| Total cations | ND | 14.0 | 13 |

Note: ND = None Detected.

TABLE 4

Extractable Anions

| Target Anion | Example 2 ng/cm² | Example 4 Fully cured ng/cm² | Example 4 Coalesced ng/cm² |
|---|---|---|---|
| F⁻ | <3.2 L | ND | ND |
| Cl⁻ | 17 ± 0.91 | 9.4 | 12.0 |
| NO₂⁻ | <6.4 | ND | ND |
| Br⁻ | 8.7 ± 1.4 | ND | ND |
| NO₃⁻ | <6.4 | ND | ND |
| PO₄³⁻ | <6.4 | ND | ND |
| SO₄²⁻ | <6.4 | ND | ND |
| Total Anions | 19 | 9.4 | 12.0 |

TABLE 5

Outgassing

| Target Compound/Group | Example 2 ng/cm² | Example 4 Fully cured ng/cm² | Example 4 Coalesced ng/cm² |
|---|---|---|---|
| Total Hydrocarbons | ND | 28.0 ± 12.0 | 35.0 ± 11.0 |
| Total organic acids | ND | 3.0 ± 5.0 | ND |
| Acrylic acid | ND | ND | ND |
| Methacrylic acid | ND | ND | ND |
| Benzoic acid | ND | ND | ND |
| 2-Ethylhexanoic acid | ND | ND | ND |
| Total amines | ND | ND | ND |
| Total amides | ND | ND | ND |
| BHT | ND | ND | ND |
| Total other esters | ND | 6.0 ± 9.0 | ND |
| Alkyl acrylates | ND | ND | ND |
| Siloxanes | ND | ND | ND |
| Phenols/alcohols | ND | ND | ND |
| DMAP/CHAP | ND | ND | ND |
| Other unkown | 4.0 ± 1.0 | 1.0 ± 2.0 | ND |
| Total Outgassing | 4.0 ± 1.0 | 38.0 ± 22.0 | 35.0 ± 11.0 |

Through-soldering Conditions

Soldering through coatings according to the present invention was easily achieved using a soldering iron heated to 370° C. (700° F.) and a solder having a 60/40 Sn/Pb ratio. The molten solder melted the coating over a metal trace and adhered well to provide an electrical connection at a selected point of a flexible circuit. Evaluation of coalesced-only coatings and fully-cured coatings revealed that fully-cured coatings required approximately three seconds for through-soldering, while coalesced-only samples soldered through immediately. Molten solder was observed to flow to the edge of a coating leaving no unprotected areas of the conductive surface exposed. Soldered connections appeared to be secure and could not readily be pulled or scraped away.

Coating formulations, preferably containing epoxy oligomers, and related procedures for electrophoretic deposition of coatings have been described according to the present invention. In light of the present disclosure, those of skill in the art will appreciate that changes may be made to the embodiments disclosed herein without departing from the spirit and scope of the invention.

What is claimed is:

1. A flexible printed circuit comprising:

a film substrate;

a plurality of conductive traces adjacent to a surface of said film substrate; end an insulating coating deposited only on said plurality of conductive traces, said insulating coating comprising a cured polymer composition having a concentration of extractable ionic contaminants less than about 200 nanograms/cm$^2$; and a concentration of labile components less than about 36,000 nanograrns/cm$^2$, said flexible printed circuit having a bend radius below 3.0 mm without damage to said insulating coating.

2. The flexible circuit of claim 1, further comprising an electrical connection to at least one of said plurality of conductive traces through a layer of said cured polymer composition.

3. A flexible circuit according to claim 1, wherein said cured polymer comprises a polyepoxy-based polymer.

4. The flexible circuit of claim 3, wherein said polyepoxy-based polymer is a reaction product of a bis-phenol A containing moiety and a substitued fluorene monomer selected from the group consisting of flourene bis-phenol flourene, bis-N-methylaminophenyl flourene and bis-glycidoxy-phenylflourene or combinations thereof.

5. The flexible circuit of claim 1, wherein said flexible circuit is substantially free from curl.

6. The flexible circuit of claim 1, wherein said polymer forms by heating.

7. The flexible circuit of claim 6, wherein said curved polymer forms by heating said insulating coating in a temperature range from about 100° C. to about 350° C.

8. The flexible circuit of claim 1, wherein said cured polymer forms under the influence of radiant energy.

9. The flexible circuit of claim 8, wherein said radiant energy is ultraviolet radiation.

* * * * *

UNITED STATES PATENT AND TRADEMARK OFFICE
CERTIFICATE OF CORRECTION

PATENT NO. : 6,803,092 B2
DATED : October 12, 2004
INVENTOR(S) : Pocius, Alphonsus V.

It is certified that error appears in the above-identified patent and that said Letters Patent is hereby corrected as shown below:

Column 10,
Lines 4-5, delete "alicylic" and insert -- alicyclic -- therefor.
Line 37, delete "12-propanedione" and insert -- 1,2-propanedione -- therefor.
Line 37, delete "2-ethoxy-carbonyl)" and insert -- 2(o-ethoxy-carbonyl) -- therefor.

Column 14,
Line 17, delete "14 mJ/m$^2$" and insert -- 140 mJ/m$^2$ -- therefor.

Column 19,
Line 10, delete "end" and insert -- and -- therefor.
Line 17, delete "nanograns/cm$^2$" and insert -- nanograms/cm$^2$ -- therefor.

Column 20,
Line 6, delete "substitued" and insert -- substituted -- therefor.
Lines 7-8, delete "flourene bis-phenol, flouorene" and insert
-- fluorene bis-phenol, biscresol fluorene -- therefor.
Line 9, delete "phenylflourene" and insert -- phenyl fluorene -- therefor.
Line 12, after "said" insert -- cured --.
Line 14, delete "curved" and insert -- cured -- therefor.

Signed and Sealed this

Twenty-fourth Day of May, 2005

JON W. DUDAS
*Director of the United States Patent and Trademark Office*